United States Patent [19]

Ankrom et al.

[11] Patent Number: 4,909,429

[45] Date of Patent: Mar. 20, 1990

[54] METHOD AND APPARATUS FOR SOLDER DEPOSITION

[75] Inventors: Michael J. Ankrom, Baltimore; James A. Rew, Millersville, both of Md.

[73] Assignee: Westinghouse Electric Corp., Pittsburgh, Pa.

[21] Appl. No.: 257,911

[22] Filed: Oct. 14, 1988

Related U.S. Application Data

[62] Division of Ser. No. 32,427, Mar. 30, 1987, Pat. No. 4,801,069.

[51] Int. Cl.$^4$ .............................................. B23K 1/00
[52] U.S. Cl. ...................................... 228/57; 269/903; 228/44.3
[58] Field of Search ............... 228/57, 6.2, 44.3, 44.7; 156/583.1, 583.3, 583.91; 269/903, 254 CS, 221, 224, 246

[56] References Cited

U.S. PATENT DOCUMENTS

| | | | |
|---|---|---|---|
| 1,385,088 | 7/1921 | Mellor | 269/221 |
| 1,796,764 | 3/1931 | Perry | 269/221 |
| 2,612,794 | 10/1952 | Pleasance | 269/221 |
| 3,262,694 | 7/1966 | O'Farrell | 269/903 |
| 3,759,436 | 9/1973 | Foster | 228/57 |
| 4,448,406 | 5/1984 | Hallberg | 269/224 |
| 4,669,416 | 6/1987 | Delgado | 269/903 |
| 4,706,602 | 11/1987 | Polacek | 269/254 CS |
| 4,730,819 | 3/1988 | Hirschhorn | 269/903 |

Primary Examiner—Kurt Rowan
Attorney, Agent, or Firm—W. G. Sutcliff

[57] ABSTRACT

A method and an apparatus for depositing solder onto component lead pads of a printed wiring board. Solder preforms which are multi-layer, solder containing members are positively biased against the pwb pad which is then introduced into a vapor phase environment defining a temperature gradient between approximately ambient and the temperature of a saturated vapor of a first selected fluid which defines a primary saturated vapor phase with a boiling point which is greater than the melting point of solder. A second fluid having a boiling point which is lower than the first fluid is utilized to generate a secondary vapor blanket in order to prevent excessive loss of the fluid defining the primary vapor phase. The pwb is heated according to a controlled process in which the temperature of the pwb is continuously monitored. The apparatus is a pressure fixture usable for vapor phase solder deposition of a pwb and comprises a first and a second member which are removably fastened together in an opposed relationship with a pwb is disposed between the first and the second members.

3 Claims, 14 Drawing Sheets

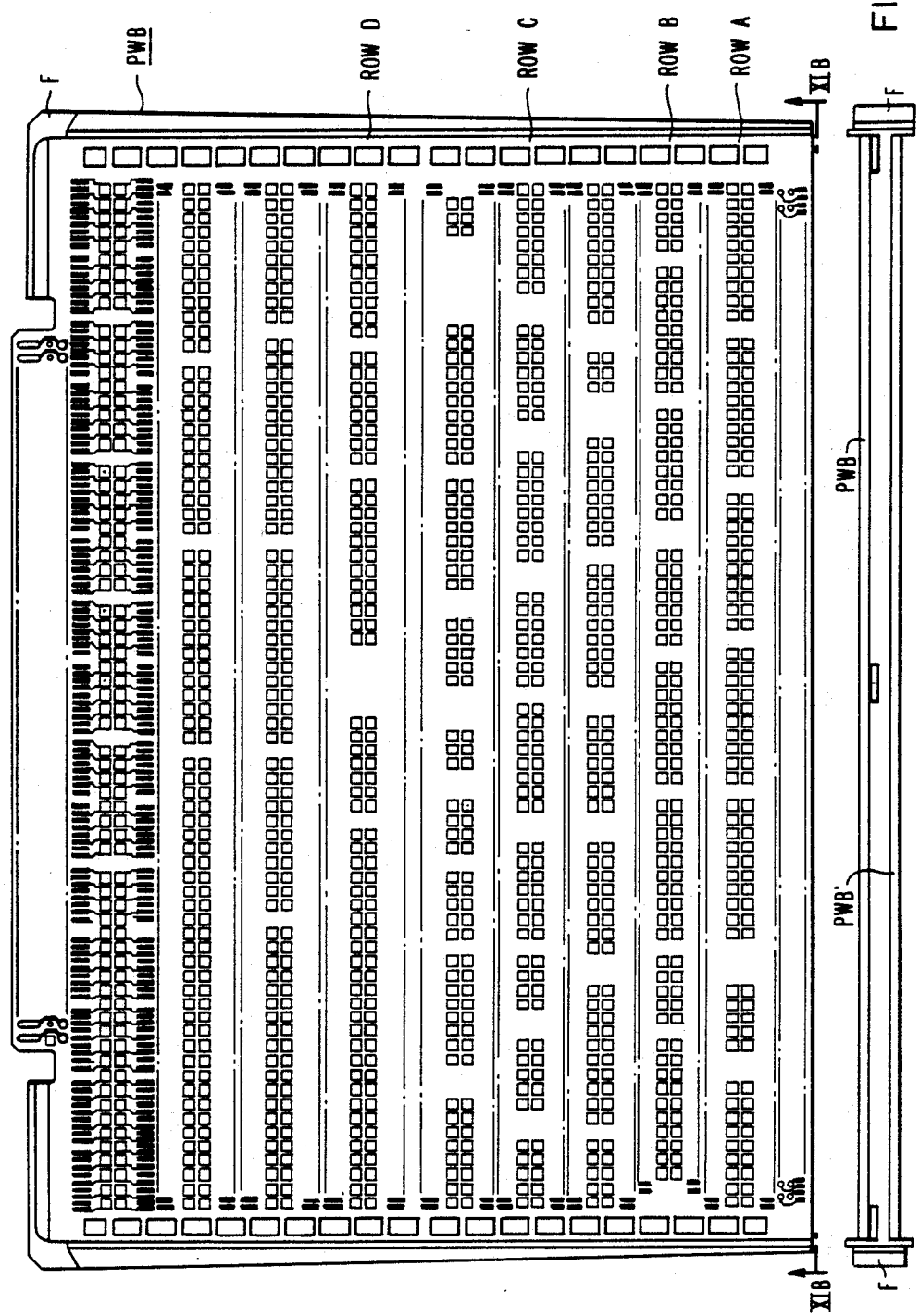

METHOD AND APPARATUS FOR SOLDER DEPOSITION

This is a division of application Ser. No. 07/032,427, filed Mar. 30, 1987 now Pat. No. 4,801,069 issued on Jan. 31, 1989.

CROSS-REFERENCE TO RELATED APPLICATIONS

This application is related to the following U.S. Patent and copending U.S. Patent Applications: "Vapor Phase Soldering Apparatus", Ser. No.07/032,428, filed Mar. 30, 1987, now abandoned; "Method and Apparatus for Printed Wiring Board Component Assembly", Ser. No.07/032,429, filed Mar. 30, 1987 and issued on Feb. 7, 1989 as U.S. Pat. No. 4,802,276; and "Method for Vapor Phase Soldering", Ser. No. 07/032,426, filed Mar. 30, 1987.

FIELD OF THE INVENTION

The invention provides both a method and an apparatus for printed wiring board assembly.

DESCRIPTION OF THE PRIOR ART

In the assembly of printed wiring boards, it is the conventional practice to deposit a specific volume of solder on printed wiring boards (PWB) by means of using solder paste or, for example, the manual depositing of solder with a soldering iron and solder wire. Screen printing solder paste does not lend itself to the characterization of a highly controlled process. The solder paste material itself is hard to control from a solder-to-flux ratio standpoint. Moreover, the reflowed paste produces different volumes of solder on the individual pads of the PWB. As a result of the lack of uniformity in the amount of solder on each of the pads, joint defects are caused during final assembly. Another unfortunate occurrence is the presence of solder balls on the PWB. Solder balls are caused by the reflow of solder paste. Additionally, each different PWB style requires a specific screen for the application of solder paste thereon. It is clearly obvious that the manual deposition of solder to the individual sites of a PWB is a very labor-intensive process. Additionally, the potential for damage to the PWB from the soldering iron is always present. One suggested change to the process of depositing solder on a component part or the like is offered by Raychem Corporation which developed a solder preform called "SolderQuik." The SolderQuik preform was developed to attach flex cable to a connector with a preform by flowing the solder with a heater bar.

However, it has been a long-standing need to provide a method and apparatus whereby a specific volume of solder can be deposited on flatpack printed wiring boards. U.S. Pat. No. 4,605,833, the contents of which are incorporated herein by reference, discloses a method for bonding the leads of a lead frame to a printed wiring board by controlling the pressure versus time relationship such that the annealing temperature is reached without excessive heating. Another approach is found in U.S. Pat. No. 4,560,100 which employs a laser to flow the solder.

There has also been a long-standing need to provide an improved technique for depositing electronic components to both sides of a printed wiring board pair simultaneously without damaging the electronic components or skewing them from their located position. While it is known in the industry to secure the individual components to a PWB by means of a cement applied to either the component or the PWB, or both, and to deposit the component onto the PWB by means of a robotic manipulator, certain problems still remain with this process. For example, the ability to deposit a component onto a PWB so that the component remains where initially located, neither skewing from its original position and having the multiple leads extending from the component body in the proper location on the PWB pads is necessary for efficient assembly.

Problems encountered in the conventional techniques included the presence of a high defect rate caused by missing toe fillets in the soldered joint during reflow soldering flatpack component leads to a solder-deposited PWB. Also, contributing to the defect rate was bumpy, dull soldered joints.

It has been suggested that vapor phase soldering be utilized and at times that it has been implemented, many of the afore-described problems were present. A vapor phase process relies on the latent heat of vaporization of a liquid condensing from its saturated vapor phase. This phase change results in extremely rapid transfer of energy from the vapor to a core item immersed in the vapor. In the use of the vapor phase process as a soldering technique, any solder and flux required by the item, such as the PWB, are applied prior to the immersion of the item in the vapor. As the item is lowered into the region of saturated vapor, the vapor condenses onto all the surfaces of the cooler part, heating it rapidly and uniformly to the required soldering temperature. Because the temperature of the saturated vapor is equal to the boiling point of the liquid, the soldering temperature is determined by the fluid chosen. For any given fluid, this temperature is constant. The amount of energy available can be varied without affecting the temperature. This results in a process which is simple, flexible and adaptable to a variety of applications, regardless of product geometry. An example of a single vapor system for soldering, fusing or brazing is taught in U.S. Pat. No. 4,558,524 to USM Corporation, the contents of which are incorporated herein by reference as it fully set forth. Additional patents directed to a vapor phase process include: U.S. Pat. No. 4,389,797; U.S. Pat. No. 4,394,802; U.S. Pat. No. 4,629,420; and U.S. Pat. No. 4,541,358; the contents of these patents are incorporated herein by reference as if it fully set forth. The HTC Corporation makes commercially available a series of models for use in the vapor phase process and identified as PHASE-FOUR Systems.

It is therefore an object of the present invention to provide an improved solder deposition process which utilizes modified a multi-layer preform member and a unique pressure fixture for holding the PWB pair.

It is a further object of this invention to provide an improved vapor phase soldering apparatus which includes a secondary vapor phase fluid delivery and control system, a thermocouple-controlled elevator system, and an improved cover for the apparatus well chamber.

It is still another object of this invention to provide a method for vapor phase solder deposition which is computer-controlled and provides a multiple zone profile with a distinct and rapid cool-down phase.

It is yet another object of this invention to provide a technique for flatpack assembly and a flatpack assembly adhesive curing fixture.

It is still another object of this invention to provide an improved process for multiple fluxing vapor phase soldering.

It is another object of this invention to provide an improved method for multiple fluxing vapor phase soldering which incorporates a computer-controlled vapor phase profile defining distinct zones and a rapid cooldown phase.

SUMMARY OF THE INVENTION

The invention provides both a method and an apparatus for depositing solder onto component lead pads of a printed wiring board. The method is comprised of the following steps. A fluxing agent is applied to the pwb and solder preforms are applied on at least some of the pwb pad rows such that solder is disposed proximate the pads. The solder preform is positively biasing against the pwb pad. The solder preform is a multi-layer member with at least a first layer, a second layer and a third layer. The first layer defines a cover layer, one face of which has an adhesive layer thereon. The second layer defines a first window layer having a plurality of window means therethrough which are in a predetermined pattern which corresponds to the predetermined pattern of at least one row of the component pads of the printed wiring board, the first window layer has one face with an adhesive layer and a second face which is in intimate contact with the adhesive layer of the cover layer. The third layer defines a second window layer having a plurality of window means therethrough which are in a predetermined pattern which corresponds to the predetermined pattern of the first window layer widow means such that a continuous window means is defined through the first and second window layers. The second window layer has one face with an adhesive layer and a second face which is in intimate contact with the adhesive layer of the first window layer. At least one continuous ribbon of solder is disposed between the cover layer and the first window layer so as to be alternately exposed and covered by the first window layer and its window means. The second window layer's adhesive layer removably adheres the multi-layer member to the printed wiring board.

The pwb is introduced into a vapor phase environment defining a temperature gradient between approximately ambient and the temperature of a saturated vapor of at least a first selected fluid which defines a primary saturated vapor phase with a boiling point which is greater than the melting point of solder. A second fluid having a boiling point which is lower than the first fluid is utilized to generate a secondary vapor blanket in order to prevent excessive loss of the fluid defining the primary vapor phase.

The pwb is heated as follows: initially heating the pwb to a predetermined first temperature selected to activate the flux and permit the flux to outgas before reflow and maintaining the pwb at said predetermined first temperature which is between about 120 degrees Celsius and 130 degrees Celsius for a predetermined first period of time, heating the pwb to a predetermined second temperature selected to preheat the pwb to a temperature which is slightly less than the melting point of the solder and maintaining the pwb at said predetermined second temperature which is between about approximately 180 and 190 degrees Celsius for a predetermined second period of time, and heating the pwb to a predetermined third temperature selected to preheat the pwb to a temperature which is at least equal to the melting point of the solder and maintaining the pwb at said predetermined third temperature which is between about approximately 205 and 215 degrees Celsius for a predetermined third period of time.

The pwb is cooled quickly by reducing the temperature below the third selected temperature by the vapor phase environment secondary vapor phase blanket so that the solder is in a solid state. The pwb is then withdrawn from the vapor phase environment.

The pressure fixture of this invention is usable for vapor phase solder deposition of a pwb. Typically, the pwb has a predetermined dimension and a plurality of pad rows arranged in a predetermined pattern such that each pad row is a determinable distance from at least one adjacent pad row. The pressure fixture comprises a first member and a second member each having means associated therewith to secure the first and second members together in an opposed relationship. The first member includes a first frame means, a first thin sheet means and a plurality of first biasing means disposed therebetween in order to resiliently secure the first thin sheet means to the first frame means. The second member includes a second frame means, a second thin sheet means and a plurality of second biasing means disposed therebetween in order to resiliently secure the second thin sheet means to the second frame means. A pwb is disposed between the first and the second members so as to be in contact with the first and second thin sheet means and the securing means cooperate to positively bias the pwb thereinbetween. The pressure fixture's plurality of biasing means are arranged between the thin sheet means and the frame means of both the first and second members to generally correspond with the predetermined pattern of the pwb pad rows.

BRIEF DESCRIPTION OF THE DRAWINGS

The above, as well as other features and advantages of the present invention, can be readily appreciated through consideration of the detailed description of the invention in conjunction with the several drawings in which:

FIG. 11A is a plan view of a printed wiring board pair and FIG. 11B is a view of the PWB pair along lines XI—XI of FIG. 11A;

DETAILED DESCRIPTION OF THE INVENTION

I. Vapor Phase Soldering Apparatus

Figure 1:
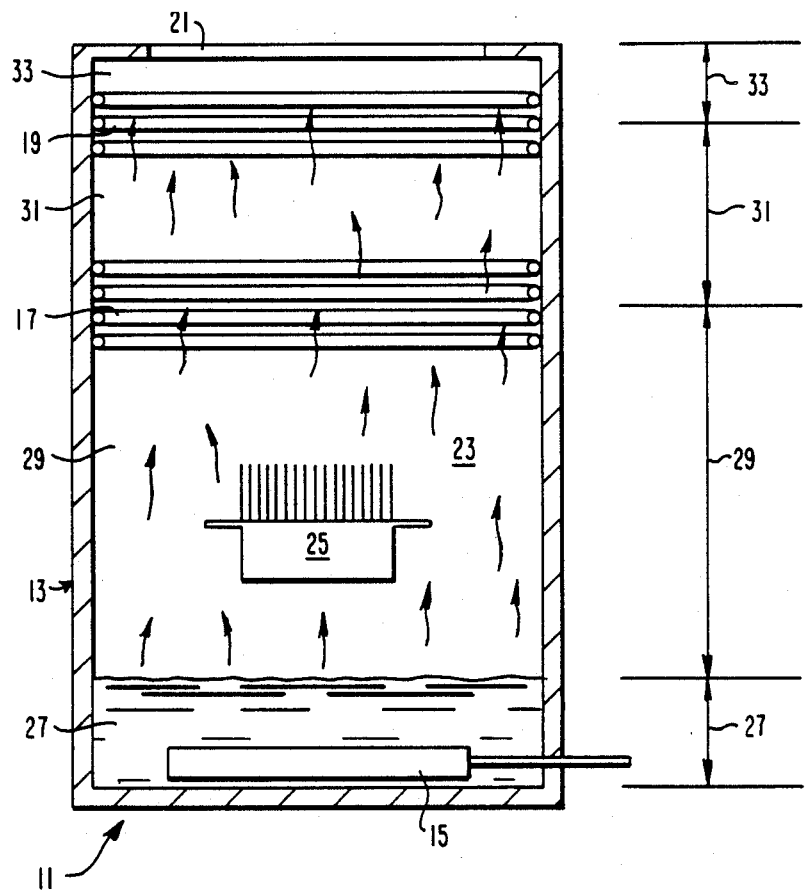
FIG. 1 is a cross-sectional schematic representation of a prior art apparatus used in a conventional vapor phase process.

Turning first to FIG. 1, a conventional apparatus for affecting the vapor phase soldering process is generally indicated by the reference character 11. The apparatus includes a housing 13 having a heater element disposed in the bottom thereof as at 15. A primary condensing coil 17 is disposed proximate the midportion of the housing 13. A secondary condensing coil 19 is disposed proximate the upper portion of the housing 13. An opening as at 21 is located in the uppermost portion of the housing 13 to allow for the introduction of component parts into the chamber area 23 of the housing 13. The component parts schematically represented at 25 are lowered into and raised from the chamber 23 by means of an elevator which is not illustrated herein but will be described in detail below. Generally speaking, when the product is lowered into the region of saturated vapor above the boiling heat transfer liquid 27, the vapor 29 condenses onto all the surfaces of the cooler part 25, heating it to the soldering temperature. Since the temperature of the saturated vapor is equal to the boiling point of the liquid, the soldering temperature is determined by the fluid chosen. The most commonly used of these fluids has a boiling point of 215° C. (419° F.), a temperature which is 32° C. above the melting point of a tin/lead eutectic alloy. This makes the process ideal for reflow of widely used alloys with similar compositions, examples of which are 63Sn/37Pb, 60Sn/40Pb, 62Sn/36Pb/2Ag.

A secondary vapor blanket 31 which consists of R113 (trichloro-trifluoro-ethane) is used to prevent excessive losses of the primary fluid. The secondary condensing coil 19 is provided to establish the level of the secondary blanket in a condensation rate control system which permits the automatic additions of the secondary fluid. An air blanket is also present.

The conventional system described above also incorporates a primary fluid filtration system, not illustrated herein, which draws the primary liquid 27 from the bottom of the chamber 23, conveys it through a filter system and reintroduces it into the apparatus 11. Typically, a batch filtration unit consisting of a stainless steel pump with high temperature seals and a 10-micron filter element is provided to remove flux from the primary fluid. Some flux may be washed off of the part 25 during the soldering operation. If allowed to build up, the flux could deposit on the inside of the vapor phase apparatus.

An acid stripper is provided for use in combination with the secondary vapor blanket. During operation, some breakdown of the secondary fluid causes formation of small amounts of acid. To minimize effects of corrosion, an acid stripper is supplied. The acid stripper will be described in detail below in conjunction with the description of the improvements to this apparatus.

The prior art vapor phase apparatus has an undesired dynamic secondary vapor level which is caused in part by the varying input of the secondary fluid into the system. The secondary fluid is input to the machine by gravity feed from a reservoir on the machine. As the level of the reservoir decreases, the input is decreased. This has presented a problem when reflowing solder in the vapor phase due to a lack of constant temperatures in the preheat zone because of vapor level changes. Because this system is dynamic and uncontrolled to a large extent, another problem has been the inability to rapidly cool down printing wiring assemblies in order to aid in the forming of smooth solder fillets and to create the best possible metallurgical solder joint structure. The improved secondary fluid system for vapor phase, according to this invention, solves these problems through unique improvements to the secondary fluid system of the vapor phase reflow soldering apparatus.

Figure 2:
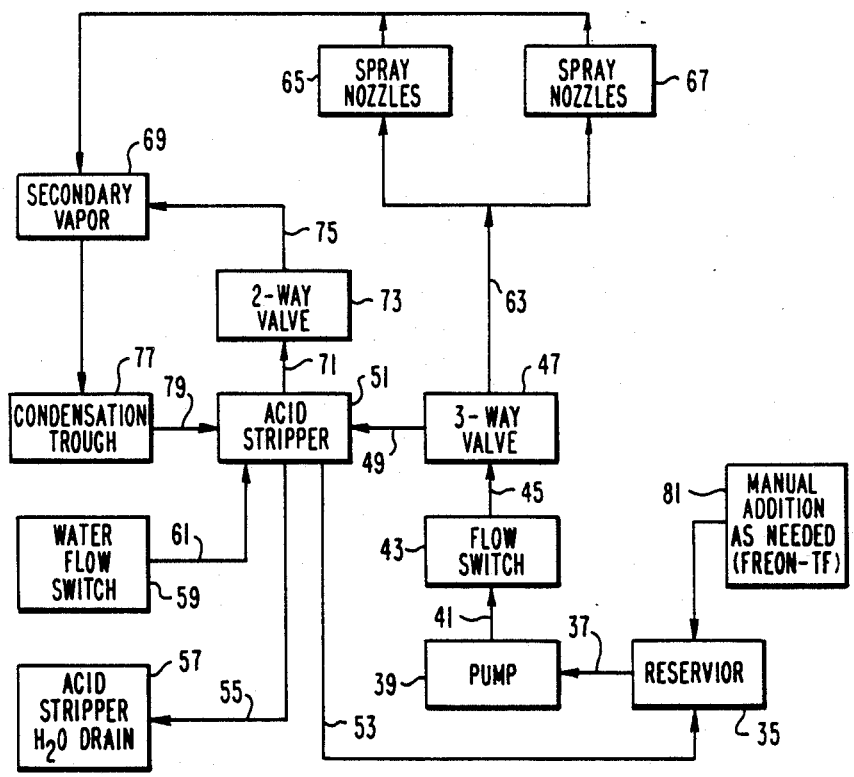
FIG. 2 is a block diagram illustrating the secondary vapor phase delivery system utilized in the vapor phase apparatus and process of this invention.
Figure 4:
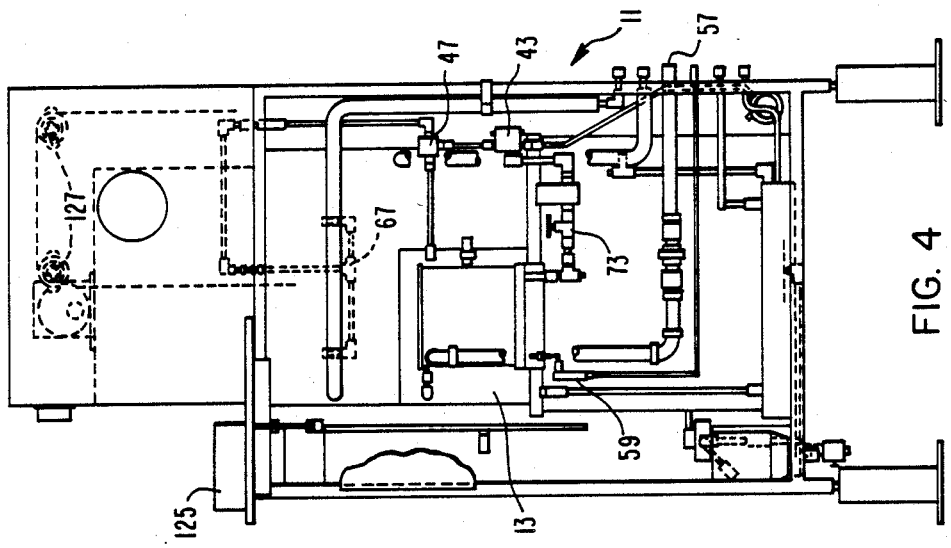
FIG. 4 is a sectional, right side elevation view of the structure illustrated in FIG. 3.
Figure 3:
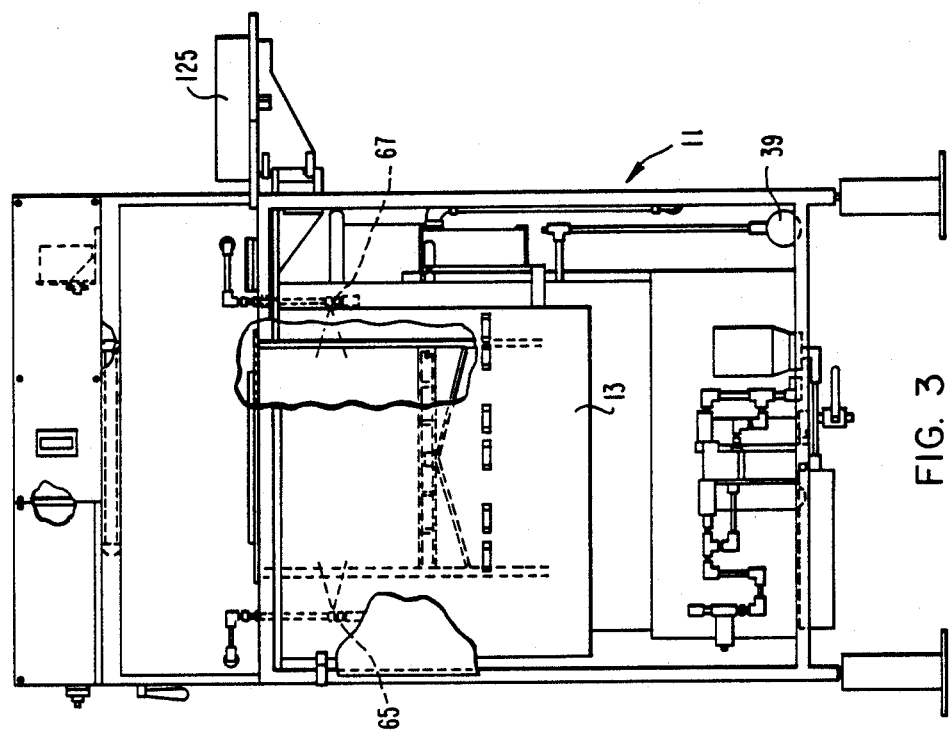
FIG. 3 is a sectional, front elevation view of the improved vapor phase apparatus of this invention.

The improved secondary fluid system for vapor phase processes can be appreciated through consideration of FIGS. 1 and 2 through 10. FIG. 2 illustrates the secondary fluid system in a block diagram while FIGS. 3 through 6 and 9 illustrate in several views, the actual improved vapor phase apparatus of this invention. The fluid for the secondary phase is maintained in a reservoir 35. The fluid is drawn from the reservoir 35 through line 37 by means of pump 39. The fluid is then conveyed from the pump 39 through line 41 to a flow switch 43. A three-way valve 47 is in communication with the flow switch through line 45. A first line 49 from the three-way valve to the acid stripper 51 is normally open. The acid stripper is used to minimize effects of corrosion because, during operation, some breakdown of the secondary fluid causes formation of small amounts of acid. Typically, an acid stripper utilizes a packed column with continuous water counterflow to strip acid from condensate. The acid stripper 51 is supplied with the required feed water through the water flow switch 59 via line 61. A first line 53 conveys stripped fluid to the reservoir 35 while a second line 55 is in communication with the acid stripper waste water drain 57. A second line 63 is in communication with the three-way value 47 to deliver fluid from the reservoir to at least two spray nozzles pairs 65 and 67. The spray nozzles pairs 65 and 67 are disposed in the apparatus 11 at the secondary vapor area 31 (FIG. 1) so as to provide a uniform spray and secondary fluid blanket in the chamber. Other spray nozzle configurations can be employed to provide the blanket-like spray. The nozzles extend through the housing 13 to provide communication from the seconary fluid delivery system to the upper portion of the apparatus 11.

The three-way valve 47 has a normally closed port to line 63 which is in communication with spray nozzles 65 and 67 by means of which the fluid is introduced selectively into the apparatus 11 in order to form at least a part of the secondary vapor blanket of the apparatus 11. The secondary vapor blanket indicated at 69 (31 of FIG. 1) is provided by spray nozzles pairs 65 and 67, or from the acid stripper 51. The acid stripper 51 contains a reservoir therein which is supplied with fluid by means of the pump 39 and the normally open port of valve 47 through line 49. The output of the acid stripper 51 reservoir is in communication with the chamber portion of the apparatus 11 by means of the line 71, the valve 73 and line 75 and provides a gravity feed of fluid to the apparatus by nozzle means or the like disposed in the upper portion of the apparatus. The volume of fluid provided by gravity feed is maintained at a desired value by providing a surplus of fluid to the acid stripper's reservoir. The acid stripper reservoir overflow is returned to the reservoir 35 by line 53. The valve 73 stops the gravity feed of fluid during periods of operation when the spray nozzles 65 and 67 are activated. By means of the condensate coils 19 in the apparatus 11, the secondary vapor is collected in a condensation trough 77 for delivery through line 79 to acid stripper 51. An automatic or manual addition of the selected secondary fluid to the reservoir 35 can be accomplished as at 81. Thus, for example, a pump could be provided to deliver fluid from, for example, a 55-gallon secondary reservoir (not illustrated) to the reservoir 35 in order to eliminate the need for periodic refilling of the reservoir and provide a constant level in the reservoir 35. The system shown in FIG. 2 provides a selective and constantly controllable input of secondary fluid to the secondary vapor phase and provides a more constant secondary vapor blanket. The flow switch 43 in the system ensures a constant flow of fluid to the machine reservoir and thus a constant input. During operation, the pump 39 forces secondary fluid through spray nozzles 65 and 67 located in the vapor phase apparatus and surrounds the elevator with a continuous spray of the secondary fluid. During the cool down phase, the fluid changes from a liquid state to a vapor state, rapidly absorbing the heat from the printed wiring board. This rapidly cools the solder joint, producing the desired and improved results i.e., a significantly improved solder deposit or solder joint, as will be described in detail below. After rapid cool down is completed, the ports of valves 47 and 73 are returned to their normal positions.

Figure 5:
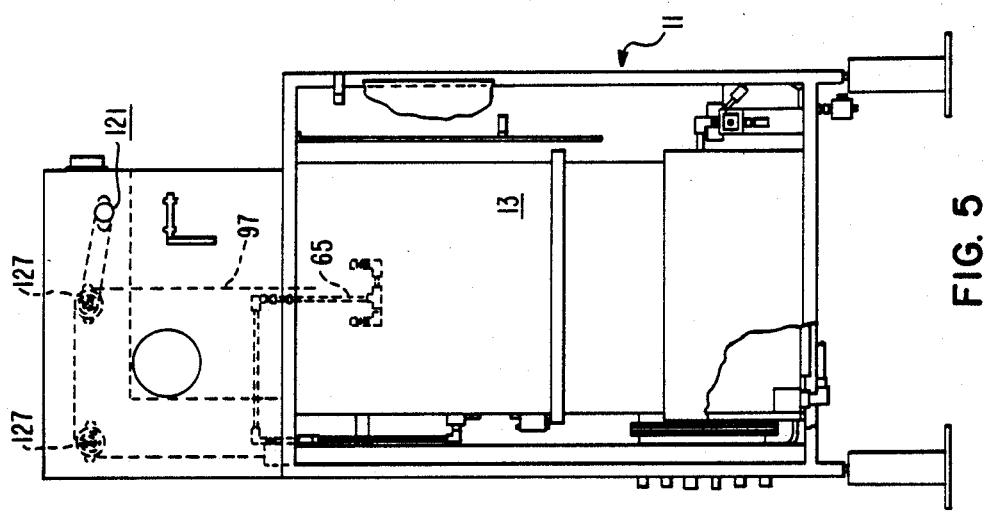
FIG. 5 is a sectional, left side elevational view of the structure illustrated in FIG. 3.
Figure 6:
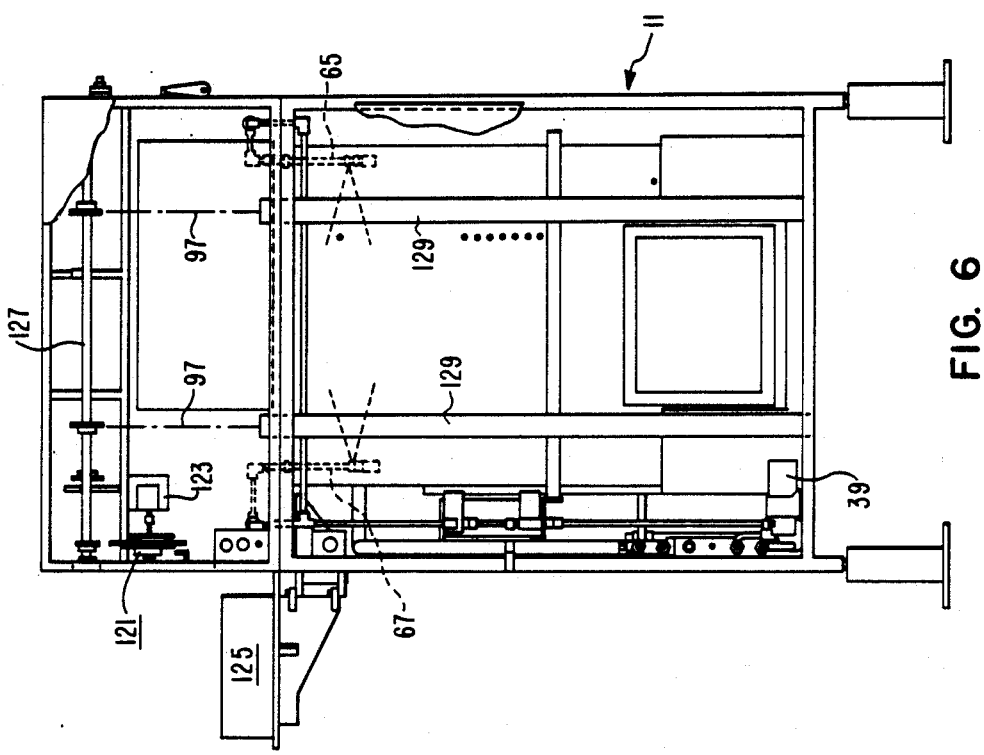
FIG. 6 is a sectional, rear elevational view of the structure illustrated in FIG. 3.
Figure 7:
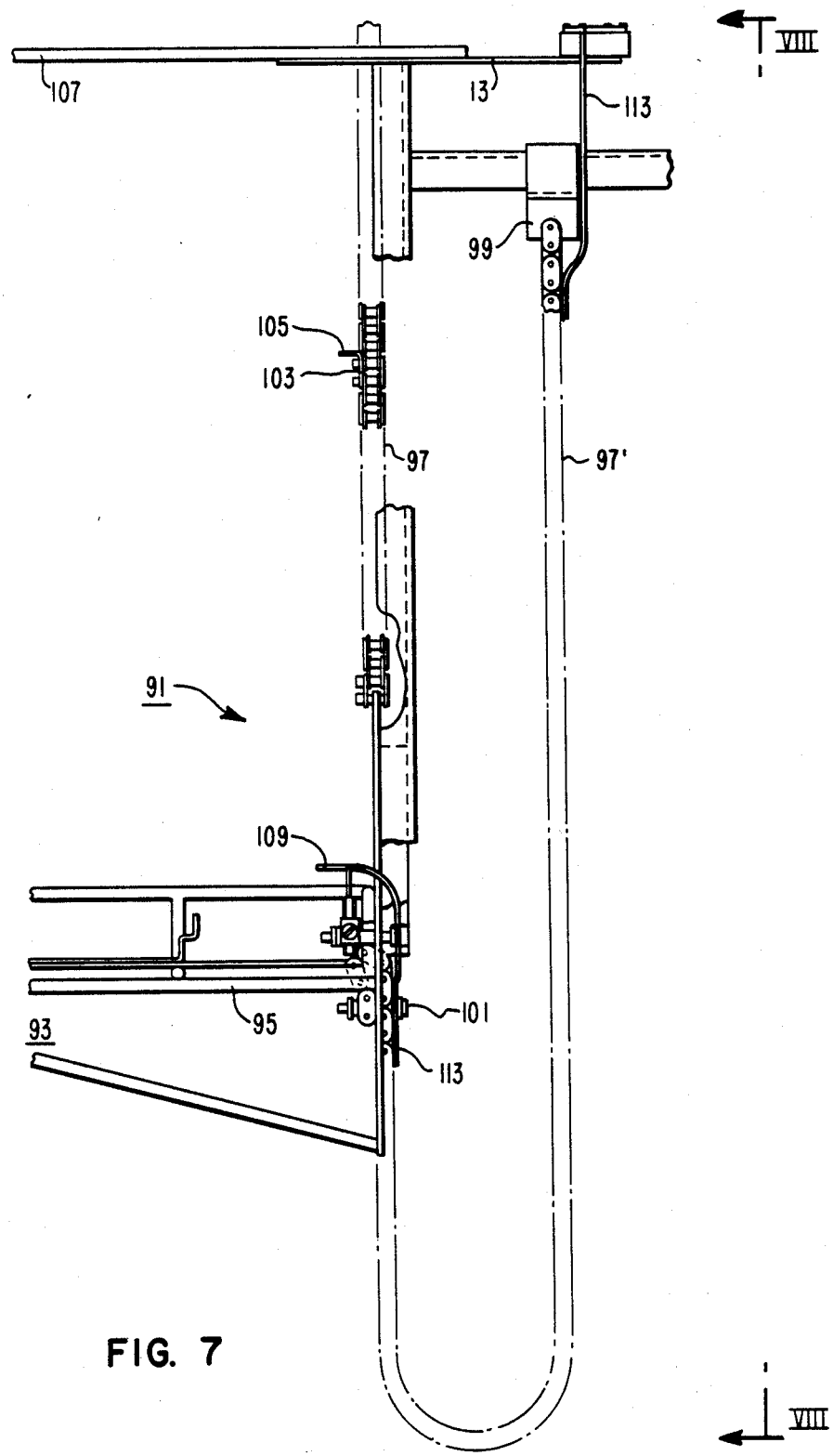
FIG. 7 is a sectional view of the elevator used in combination with the vapor phase apparatus of this invention.
Figure 8:
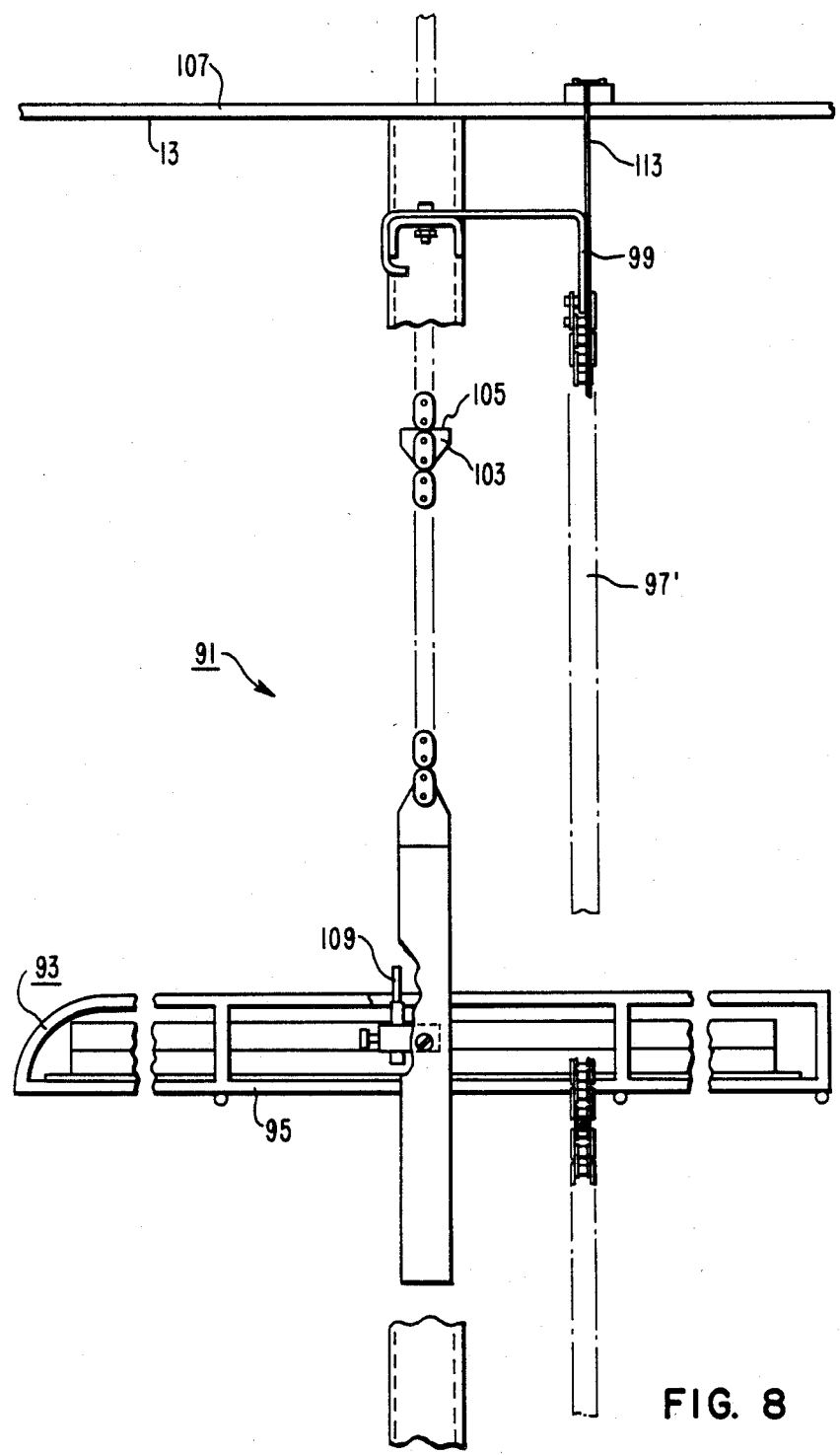
FIG. 8 is a sectional view of the apparatus of FIG. 6 along lines VIII—VIII thereof.
Figure 9:
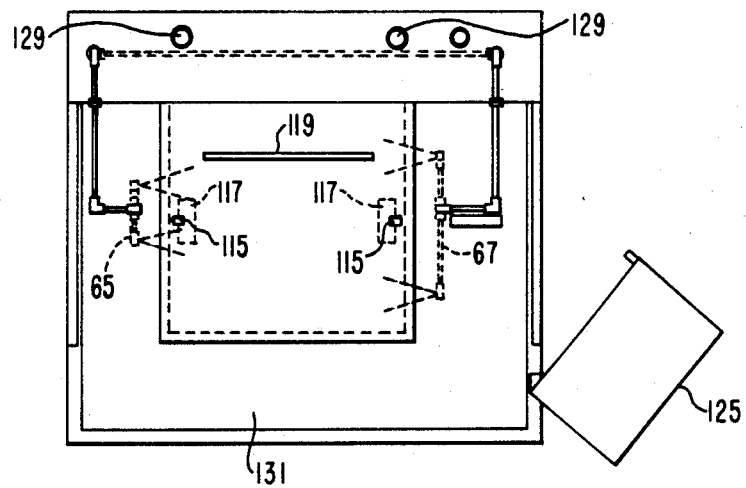
FIG. 9 is a plan view of the vapor phase apparatus illustrated in FIG. 6.

Turning now to FIGS. 7 and 8 the configuration of the elevator system of the vapor phase apparatus 11 can be fully appreciated. FIG. 7 shows a front elevation sectional view of the elevator system and FIG. 8 shows a side elevational view along lines VIII—VIII of FIG. 7. The topmost portion of the housing 13 is shown in both FIGS. An elevator is generally indicated at the reference character 91 and includes a supporting-frame, shelf-like member 93 designed to receive thereon the parts to be conducted through the vapor phase apparatus. Typically, the member 93 is an open-framed construction with a grate-like bottom portion 95 to allow vapor flow therethrough and about the part seated thereon. The member 93 is movably supported by supporting means 97 which typically comprise a chain link member which extends from the shelf-like member 93 to the drive unit disposed above the housing 13. The drive unit 121 (FIG. 3-6) comprises a servo motor 123 responsive to a computer control means 125. As can be seen, at least one of the supporting means 97, as illustrated herein, the right side chain, includes a further portion 97' by means of which the electrical leads 113 of a thermocouple means 109 are in communication with the computer control means 125. The chain portion 97' extends from a fixed point 99 near the upper portion of the housing 13 and is adjustably secured to the shelf member 93 by securing means 101 such as, for example, bolts. The chain 97 includes a catch means 103 disposed a predetermined distance above the shelf member 93. The catch 103 has a horizontally extending member 105 which interacts with the cover means 107 as shown in FIG. 9 and which is described in detail hereinafter below. As can be seen in FIGS. 5 and 6, the chains 97 travel over the drive shaft and pulley system generally indicated at 127 and terminate at a pair of counter weights disposed in guide means such as tubes 129.

A thermocouple means 109 is disposed on the shelf means 93. The thermocouple is in communication with control means 125 represented in block diagrammatic form and provides a continuous temperature output signal reflective of the temperature of the component part disposed on the shelf-like member 93. The thermocouple 109 is in communication with the control means 125 via electrical leads 113 disposed along the chain member 97'. While a single thermocouple 109 is illustrated herein, it should be appreciated that multiple thermocouples can be disposed about the shelf member 93 in order to further refine the accuracy of the temperature information being provided to the control means 111.

Figure 10:
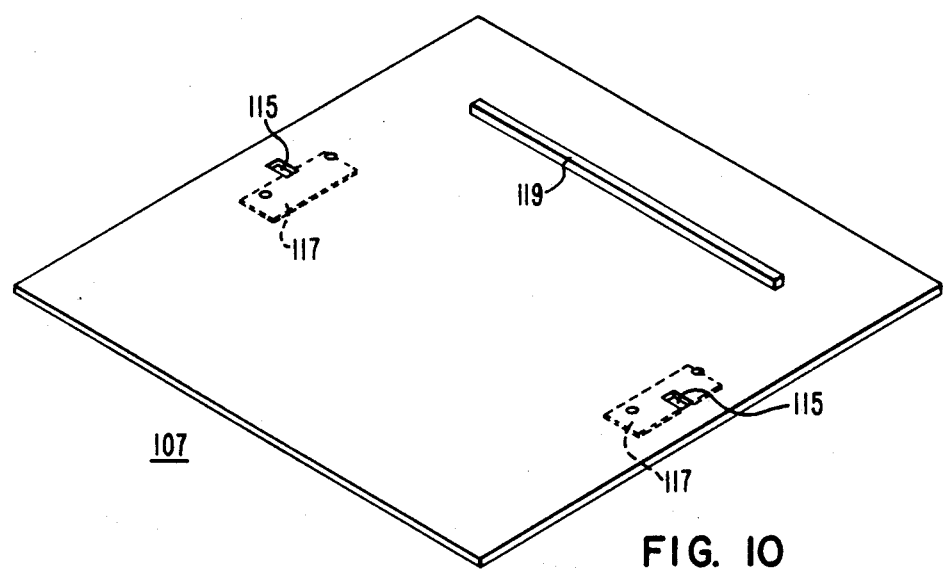
FIG. 10 is an isometric view of the improved cover for use in the secondary fluid system vapor phase apparatus of this invention as shown in FIG. 3.

The cover assembly 107 as illustrated in FIG. 10 cooperates with the elevator chain members 97 which are disposed on either end of the elevator shelf member 93 to effect the raising and lowering thereof with respect to the opening at the upper portion of the chamber of the housing 13. The cover assembly 107 is a plate-like member having holes 115 disposed on either side thereof which permit the chain 97 to pass therethrough. A strike plate 117 is provided proximate each of the holes 115 on the underside of the cover assembly and cooperates with the horizontal member 105 of the chain 103. A cover weight 119 is also provided in order provide balance and stiffness to the cover assembly as well as to facilitate its smooth operation. The cover assembly 107 is dimensioned so as to rest on the upper portion 13' of the apparatus 11 in order to substantially enclose the cell portion defined by the housing in which vapor phase process occurs. During operation of the vapor phase apparatus, the cover assembly 107 would rest on the upper portion of the housing 11. As pair of chains lift the elevator shelf member 93 from within the cell, the chains continue to pass through the openings 115 until the catch link 103 by means of the horizontal member 105 of each chain comes in contact with the strike plate 117. When this occurs, the cover assembly 107 is then lifted by the chains as the chains continue the elevational movement of the shelf means 93 from the cell. Thus, the cover is lifted from the housing and access to the elevator which is also lifted from the cell is accomplished. After the elevator shelf is unloaded or, for example, after the new parts are placed on the elevator shelf and the vapor phase process is initiated, the cover assembly will be lowered onto the apparatus 11 until the horizontal members 105 are lower than the upper portion 13' of the apparatus 11. At this time, the elevator continues its descent while the cover assembly is supported by the upper portion 13' of the housing 13.

Turning to FIG. 9, the plan view of the apparatus 11 shows the cover assembly 107 disposed over the opening in the apparatus. Additionally, a portion of the secondary vapor phase arrangement described in conjunction with FIG. 5 is also visible. For example, the spray nozzles 65 and 67 are shown to be disposed on opposed sides of the cell defined by the housing 13. The configuration described above in conjunction with describing the secondary fluid system for the vapor phase operation provides several unique advantages. This system maintains better control over a dynamic secondary vapor by maintaining a controllable input of the secondary vapor into the apparatus. The cover assembly prevents vapor loss by maintaining a closed vapor zone accept when loading or unloading a product onto the elevator shelf. It also functions as a safety barrier for the operator by minimizing exposure to the vapors. The system further enables a rapid cool-down of the product after reflow to aid in forming smooth solder fillets and good metallurgical soldered joint structure. The improved secondary phase configuration also eliminates the need for an operator to fill the reservoir on the vapor phase machine after only limited operation.

II. Solder Deposition Process

Turning to FIGS. 11A and 11B, a plan view of a printed wiring board PWB illustrates the various pad alignments which must be considered in applying solder thereto. It should be appreciated that a printed wiring board assembly typically comprises two opposed printed wiring boards located back-to-back, i.e., PWB and PWB' of FIG. 11B and supported in a mounting fixture 'F' to form what is typically called a "printed wiring board pair," or PWB pair. Optionally, the PWB board pair with connector attached is mated with its female connector to test for possible electrical shorts to ground. All ground pins form one circuit and all the other pins form a second circuit. A positive test will show than an opening exists between the two circuits. A close circuit indicates a short is present and one or both of the pairs may be faulty. After testing, the PWB board pair is vapor-cleaned in a vapor degreaser basket in a flat position so that they do not overlap or extend beyond the basket configuration. Typically, the PWB board pair is in the vapor for a minimum of two minutes. The cleaning procedure can also include spraying the PWB pair for approximately 30 seconds with a cleaning agent. Finally, the PWB board pair is removed from the degreaser and allowed to cool to room temperature. After cleaning is completed, the PWB board pair is baked for a minimum of approximately four hours up to five hours at 121° C., ±5°. After baking, the PWB board pair is ready for flux application. The pair of frame and conductor can be covered with masking tape to prevent flux from covering it. Liquid flux is sprayed on each PWB surface of the board pair to form a thin layer over the entire surface. A spray applicator with a propellant is a preferred method of application. The flux is allowed to dry between at least 15 to 75 minutes before the application of the solder to the board pair.

Figure 12A:
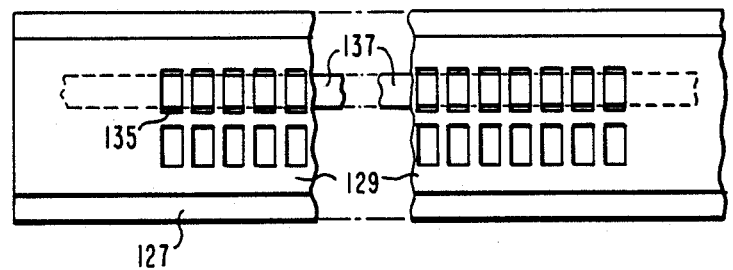
FIGS. 12A, 12B and 12C are two plan views and an exploded, slightly enlarged view of the preform along lines XII—XII of FIG. 12A respectively, of solder preforms.
Figure 12B:
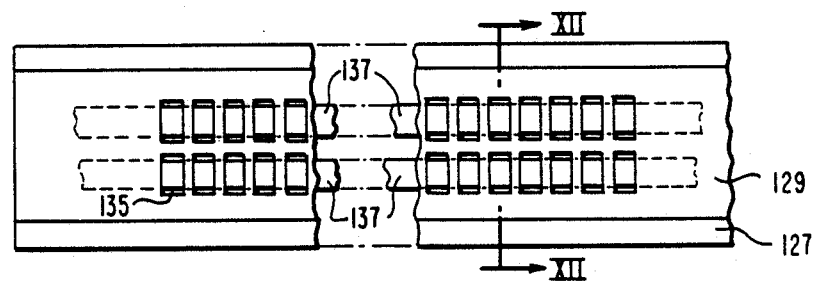
Figure 12C:
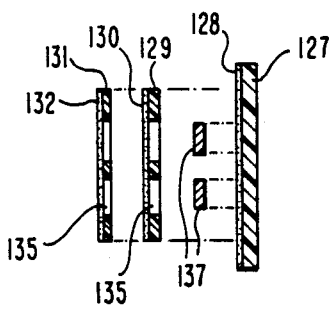

The printed wiring board PWB typically has four different row types, each of which has a unique component pad geometry. As shown in FIG. 11 (not drawn to scale), row A utilizes a ⅜ inch width preform strip, a single strip of solder with short windows. Row B utilizes ⅜ inch wide preform, double strip of solder with short windows. Row C utilizes ½ inch width preform, single strips of solder with long windows, and Row D utilizes ½ inch wide preform strips with a double strip of solder with long windows. As shown in FIGS. 12A, 12B and 12C a preform strip consists of multiple layers with at least a first layer, a second layer and a third layer. The first layer defines a cover layer 127, one face of which has an adhesive layer 128 thereon. The second layer 129 defines a first window layer having a plurality of window means 135 therethrough which are in a predetermined pattern which corresponds to the predetermined pattern of at least one row of the component pads of the printed wiring board, the first window layer has one face with an adhesive layer 130 and a second face which is in intimate contact with the adhesive layer 128 of the cover layer 127. The third layer 131 defines a second window layer having a plurality of window means 135 therethrough which are in a predetermined pattern which corresponds to the predetermined pattern of the first window layer 129 window means 135 such that a continuous window means is defined through the first and second window layers. The second window layer 131 has one face with an adhesive layer 132 and a second face which is in intimate contact with the adhesive layer 130 of the first window layer 129. At least one continuous ribbon of solder 137 is disposed between the cover layer 127 and the first window layer 129 so as to be alternately exposed and covered by the first window layer and its window means. The second window layer's adhesive layer 132 removably adheres the multi-layer preform to the printed wiring board.

The first window layer 129 is approximately 0.005 inch thick. The second window layer 131 is approximately 0.001 inch thick. (The adhesive layer would provide additional thickness to each individual layer.) The cover layer is 0.001 inch thick and a ribbon of solder which is approximately 0.036 ±0.005 inch wide and 0.0058±0.006 inch thick is disposed between layers 127 and 129. The solder 137 can be disposed in either one row of the windows as in FIG. 12A or both rows of windows as shown in the FIGS. 12B and C. Because of the differences in pad geometry on the board, there is a need for both short windows 135 as in FIG. 12A and long windows (not shown but similar to the short windows, except elongated in a direction perpendicular to a longitudinal axis of the ribbon of solder 137).

After an even coat of RMA flux is sprayed over the PWB surface and allowed to dry at room temperature for approximately 15 minutes, the preform strips are applied according to the configurations explained above. The step of applying the RMA flux accomplishes three tasks: It allows for easier alignment of the preform on the PWB; it allows the residue from the adhesive associated with the preform used in the vapor phase reflow process to be removed; and, it aids in solder reflow.

Single rows occur as the topmost and bottommost rows as well as the board midpoint. For these rows, special pieces of preform are employed. These pieces have the same hole pattern as the double pad rows, but only one strip of flattened solder in one of the rows of windows. The other row of windows is left empty. The preform for single pad rows should be applied by the same procedure as for double pad rows with the following exceptions: It should be noted that some boards have mounting pads for quadpacks which interrupt a row of pads. It should be appreciated that when such quadpack pads are present, the application of a strip of preform from side-to-side of the board must be modified so that solder is not deposited inappropriately onto the board. With a preform tape held near the end of the board, and oriented parallel to the pad row to be covered and held slightly above the pad row, the tape can be moved sideways in another direction until the end pads are observed through the end windows in the dark brown window tape. When the end pads are observed in the end windows, the end of the preform tape may be moved vertically downward until it contacts the board. The other end should not be allowed to contact the board at this point. Some pressure will be required to ensure that the tape end will stick to the board. It is recommended that the preform tape be installed starting at the bottom of a board and progressing upward to minimize contact of the installers hands with the board. Light pressure can be manually applied to the strip once it is disposed onto the PWB in order to ensure bonding between the preform and the PWB surface.

Figure 13:
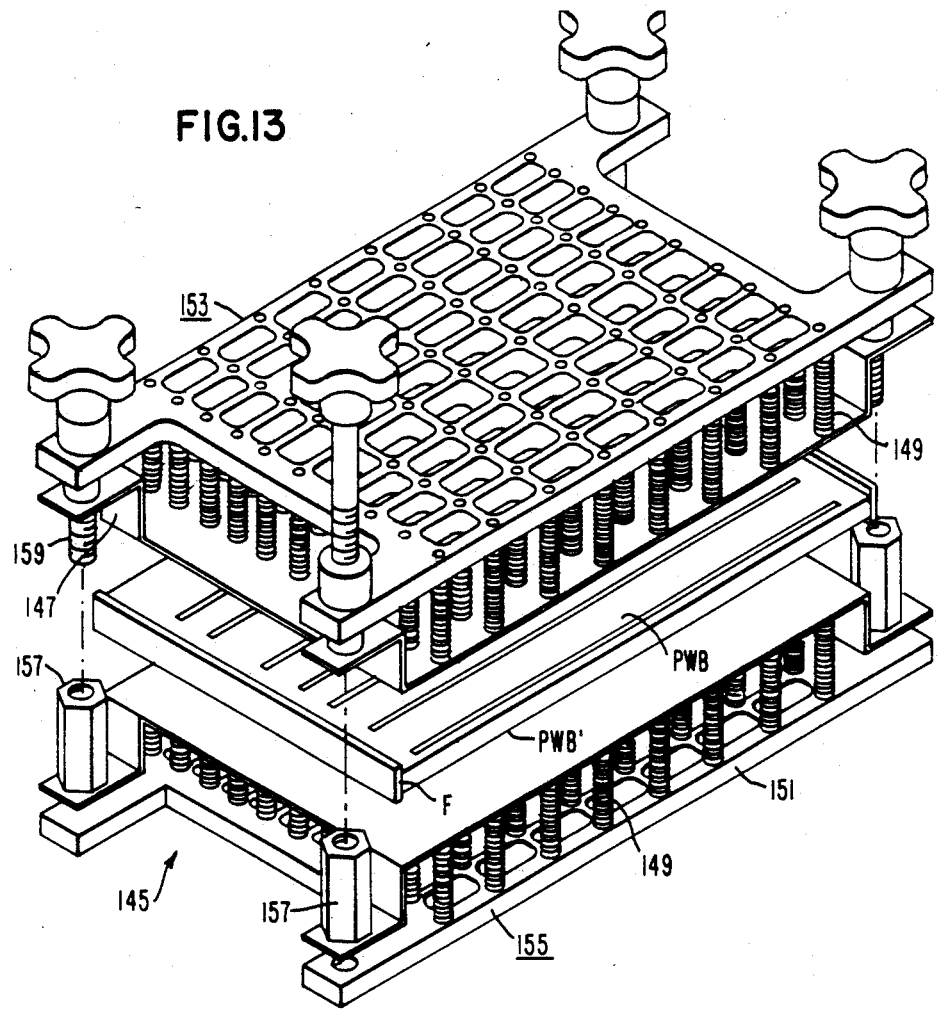
FIG. 13 is an isometric view of a pressure fixture used in combination with the solder preform in the solder deposition process.

After both PWBs of the PWB pair have been appropriately covered with the preforms, the PWB board pair is ready to be loaded into a pressure fixture generally indicated by the reference character 145 of FIG. 13. The pressure fixture 145 consists of a thin sheet of stainless steel 147 which is disposed next to the PWB surface. This sheet is pushed against the PWB by a plurality of springs 149 attached to a backup plate 151. Preferably, 10 rows of springs 149 are provided and the backup plate 151 is so configured that the springs disposed between the backup plate and the thin metal sheet 147 correspond to the rows of preform disposed on the PWB board. The pressure fixture 145 consists of a top half 153 and a bottom half 155. The bottom board 155 includes a mounting means 157 adapted to receive therein a complimentary mounting means 159 by which the top and bottom halves of the fixture 145 are secured together with the PWB board pair disposed thereinbetween. This design applies pressure to each row of the solder preforms on the PWB and allows the vapor condensation to occur on the thin sheet and does not require a board pair surface to be flat. Having thus mounted the PWB board pair in the pressure fixture 145, the PWB board pair is now ready for vapor phase solder deposition. Preferably, the vapor phase reflow soldering occurs within 24 hours of the aforedescribed period of baking. If the PWB has not been fluxed, it can be put in a holding oven at 100°, ±10° F., for a period not to exceed 96 hours.

Figure 14:
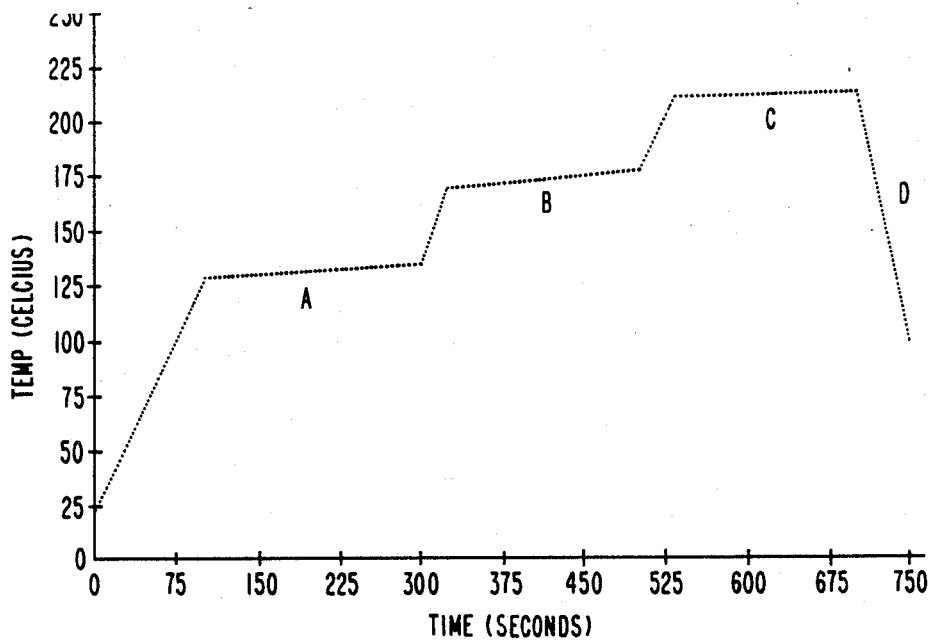
FIG. 14 is a graph representing the vapor phase profile in the solder deposition process of this invention.

Reflowing of the solder preforms to deposit the solder onto the PWB is accomplished by placing the fixtured PWB in the computer-controlled vapor phase apparatus described above and following the time temperature profile developed for this process as illustrated in FIG. 14. The profile illustrated in FIG. 14 permits a repeatable controlled solder reflow. The time temperature profile has three distinct zones: Zone A is designed to activate the flux and allow it to outgas before reflow, creating a better metallurgical solder deposit; Zone B is calculated to preheat the fixtured PWB board pair to a temperature just below the melting point of the solder preform approximately 185° C.; Zone C is calculated so that the solder actually reflows in the primary vapor zone of the vapor phase apparatus. A forth zone, Zone D represents the very rapid cool-down phase. The profile in the graph of FIG. 14 represents the ideal time and temperature profile to accomplish solder deposition. It has been determined that by following this profile, ±5° C. and ±20 seconds, excellent solder deposition can be accomplished. This process provides several unique advantages. A specific controlled volume of solder is deposited on each site on a printed wiring board where a solder joint will eventually be made. The process is not PWB style specific because it does not require a specific screen for each style as screen-printing solder paste process does. The solder is deposited on both sides of the PWB board pair at the same time. Contrary to this, screen-printing solder paste or manual solder application only does one side or one site on a PWB board at a time. The solder deposition process of this invention eliminates the need to control and inspect the solder paste, it eliminates solder ball contamination from the reflow of solder paste, and it eliminates the possible damage from use of a soldering iron in manual solder deposition.

While the solder deposition process is underway in the apparatus 11, the thermocouple provides an accurate indication of the temperature of the PWB board pair deposited on the elevator as the elevator is lowered into the cell. This permits the process to be under continuous temperature control. Because a temperature gradient exists within the apparatus 11 which ranges from 30° C. at the entry point of the elevator to approximately 215° C. near the primary liquid at the bottom of the apparatus, the temperature of the component part on the elevator can be adjusted by adjusting the relative elevation of the component part therewithin. A computer-controlled program is provided to compare the ideal time temperature profile versus that being generated during the actual solder deposition process. Therefore, by comparing these two profiles, if it should appear that the component part is cooler than appropriate at a given time in the process, the elevator can be lowered to provide additional latent heat to the component. On the other hand, if the component part is hotter than appropriate for a given time period in the process, the elevator can be raised up within the cell, thus stabilizing temperature at an appropriate value for the time into the process. Tolerances for the time-at-temperature profiles for the vapor phase reflow soldering process may vary ±5° C. and ±20 seconds after reaching 125° C., or Zone A, until the cool-down is started at the completion of Zone C. The tolerances on the time-at-temperature, once the cool-down process begins as at Zone D, are ±20° C. and ±60 second. Once Zone C is completed, it is important to reduce the temperature of the PWB board pair as quickly as possible to below 183° C. where the solder is once again in a solid state. At this temperature, i.e., less than 183° C., intermetallic formation of the solder is stopped.

Zone A lasts for approximately 200 seconds at a temperature of 125°. Zone B is maintained for a period of approximately 200 seconds at a temperature of approximately 170°, and Zone C is maintained at a temperature of approximately 212° for 170 seconds. Additional information is provided in Table I.

TABLE I

| TIME | 0 | 45 | 100 | 300 | 320 | 500 | 530 | 700 | 750 |
|---|---|---|---|---|---|---|---|---|---|
| TEMPERATURE | 20 | 75 | 130 | 135 | 170 | 179 | 212 | 214 | 100 |

After the solder deposition process is complete, the fixtured PWB board pair is withdrawn from the apparatus and is ready for further processing.

The PWB board pair is removed carefully from the fixture 145 in order to prevent damage to the fixture, the PWB board pair and heat sink. Preferably, this is done as soon as possible after the solder deposition process is complete in order to ease separation and prevent any damage to the fixture pressure pads. Upon removal from the pressure fixture, the PWB is cleaned preferably within one hour of the solder deposition process. The polymide tape on the PWB board pair is removed and discarded. This can be done with tweezers by lifting up one end and pulling it off. The PWB board pair is disposed in a vapor degreaser basket in a flat position so it does not overlap or extend beyond the basket configuration. The basket is lowered into the boil sump for 1.5 to 2.5 minutes. Both sides of the board can be sprayed for approximately one minute to complete the cleaning procedure. The PWB board pair is removed from the vapor degreaser and immersed in solvent. A brush or equivalent can be used to remove stubborn residue. The PWB board pair is then lowered into the vapor zone and a spray can be used to rinse both sides of PWB board pair for a minimum of 30 seconds each. The PWB board pair can then be removed from the vapor degreaser and allowed to cool to room temperature.

The pressure pads of the fixture 145 must also be cleaned after each use. Isopropyl alcohol or a similar cleaning agent can be used to accomplish this task. The pressure pad should be free of polymide tape, flux residue and any solder protrusions. It must be appreciated that any grooves, dents or buildup on these plates will have detrimental effects on the pressure distribution.

III. Flatpack Assembly and Fixture

In that the PWB board pair was vapor cleaned after solder deposition, it should be handled carefully and by the heat sink edges or in a suitable container. Care should be used to ensure no damage to either of the PWB board pair or heat sink frame. The method and apparatus by which flatpack assembly and adhesive curing is effected provide several unique advantages. The fixture is a dual purpose fixture; it applies a constant repeatable compressive force and it achieves high component stability during adhesive cure. The fixture applies even loading to components of varying height and assures component lead contact with the solder deposited onto the pads of the PWB. Finally, the fixture protects assembled PWB board pairs during handling.

An automated flatpack assembly process requires a component placement force of approximately 11 pounds plus or minus one pound. This is approximately five times greater than the conventional process. For example, the conventional assembly pallet could not support the PWB properly under this type of loading without flexing and resulting in poor component placement. A smaller pallet was developed to support the PWB so that it would not flex. This pallet was expanded upon to combine the assembly pallet into a fixture which could also be used during the adhesive curing process.

The component leads are in a compressive relationship with the solder pads and the adhesive is put into tension with respect to the PWB and the component body. If, during the adhesive curing cycle the components are not held in place, the force of the leads in compression would spring the components out of position, and require that the components be reworked and repositioned by hand. The assembly/adhesive curing fixture shown in FIGS. 16 and 17A, B and C, incorporates silicone rubber pads to apply a vertical hold-down force on the component and provides an X-Y frictional force to maintain component alignment. Edge spacers are disposed around the PWB to control lateral skewing of the components.

Figure 15:
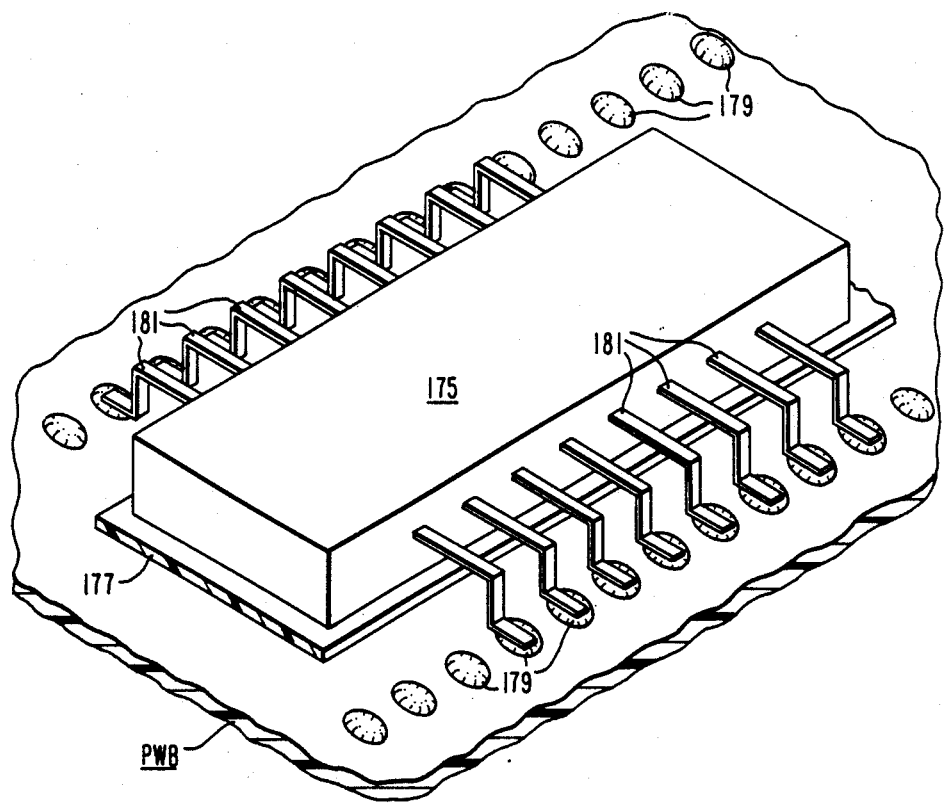
FIG. 15 is an isometric representation of a section of a printed wiring board with a component mounted thereon according to the process of this invention.

The adhesive used to secure the components to the PWB is an epoxy film adhesive commercially available and identified as "Able Film" (available from ABLESTIK CORP., Calif.). The adhesive film is stored in cold storage at $-40°$ C., $\pm 10°$, until ready for use. After removal from cold storage and stabilization at room temperature for approximately 30 minutes, the Able film is ready to be applied to the printed wiring board. The Able film is approximately centered in-between the pad rows so as not to protrude over the edges of the solder mask on the PWB surface, or in any way cover the solder-deposited pads where the flatpack leads will be soldered. Turning to FIG. 15, it can be seen that the component body 175 is disposed onto an adhesive strip 177 which, in turn, has been placed between the solder-deposited pads 179 of the PWB. When placed on the adhesive strip, the component leads 181 are placed in compression while the adhesive 177 is in tension. The components, i.e. 175, can be robotically mounted onto the PWB board pair or manually located thereon where appropriate or necessary.

Figure 16:
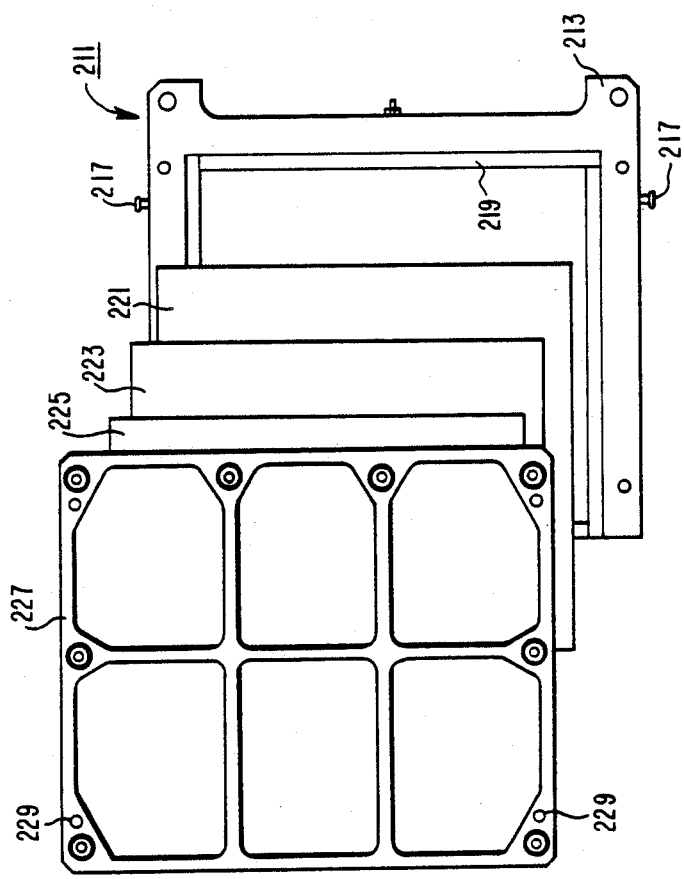
FIG. 16 is an exploded plan view of the flatpack assembly/adhesive curing fixture of this invention.
Figure 17A:
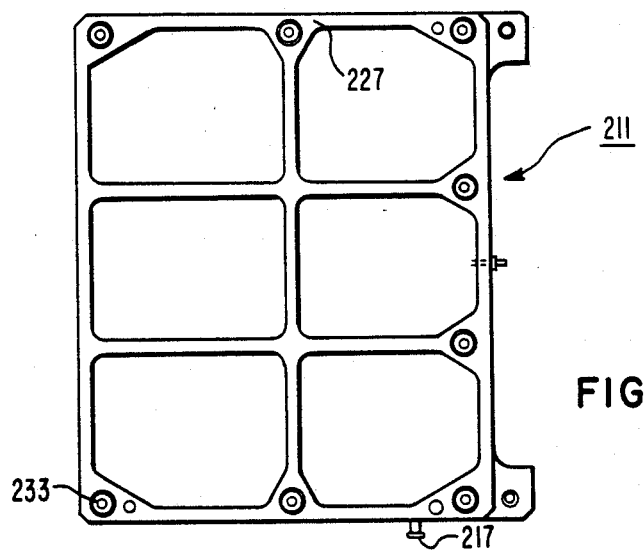
FIGS. 17A, 17B, 17C are top plan, side elevation and bottom plan views of the curing fixture of this invention.
Figure 17B:
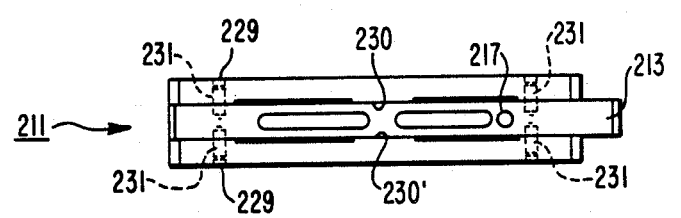
Figure 17C:
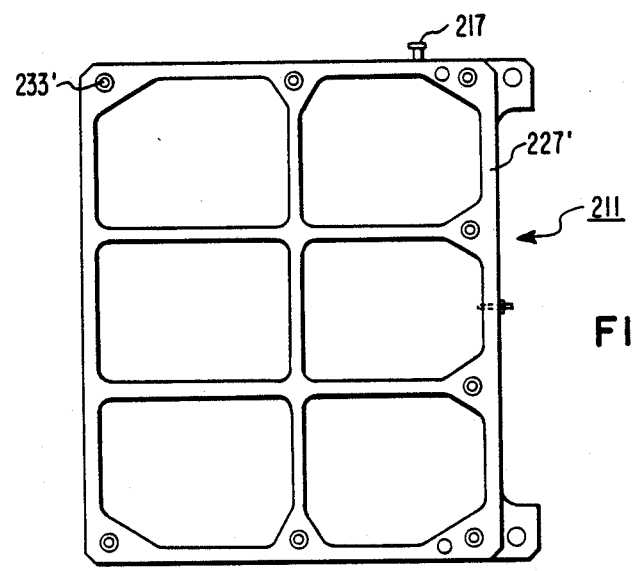

Turning to FIGS. 16 and 17A, B and C, the adhesive curing fixture is generally indicated by the reference character 211 and comprises basically a pallet 213 which is basically a U-shaped frame with slots (not illustrated) on the inside surface thereof to accept an unpopulated PWB pair. A nylon hold-down screw 217 is provided to hold the board pair in the pallet during manipulation of the pallet. Edge spacers 219 are arranged around the PWB to provide a continuous surface on the edge of the PWB on which the 0.031 inch thick solid silicone rubber compliant pad 221 rests. This pad functions to absorb and compensate for any differences in height between the various components located on the PWB and provides X-Y frictional stability. The compliant pad is backed by a stainless steel shim 223. The metal shim 223 is used to equalize the component hold-down force generated by a 0.187 inch thick silicone sponge rubber pad 225. The sponge rubber 225 is compressed when the cover member 227 is bolted to the pallet 213 by means of cover bolts 229. The cover 229 is bolted to the pallet 213 by the bolts 229 which are received in threaded bores 231. The amount of force generated is controlled and repeatable due to the fact that the cover bolts down against the pallet, surface to surface, leaving no room for error. In other words, the cover 227 overlaps the members 221, 223 and 225 so that the bottom portion 229 and 229' of each cover member 227 and 227' of FIG. 12A rests on the upper edge of the pallet member 213. The cover has alignment pins 233 to ensure that the cover is placed on vertically so that no skewing of the components takes place during assembly of the fixture for adhesive cure. It should be appreciated that both the top cover 227 and the bottom cover 227', as well as the pallet 213, preferably have the lowest thermal mass possible so as not to effect the curing cycle of the adhesive.

On single-sided boards, when used in this fixture, the edge spacers on the side of the fixture where no PWB is present can be eliminated and, instead, a 0.080 inch shim can be used to simulate the component parts; then the rubber pad and stainless steel shim are placed as before.

Preferably, the adhesive curing process is initiated within approximately one-half hour of fixture assembly. The assembly is then cured for two hours and 45 minutes (minus 15 minutes, plus 75 minutes) at $121°$ C., $\pm 5°$ C. ($250°$ C., $\pm 9°$ F.). After the cure time is complete, the fixtured PWB board pair is removed from the oven and allowed to cool as an assembly. After cooling is completed, the fixture can be disassembled.

The flatpack assembly/adhesive curing fixture serves a dual purpose. It supports the PWB pair during robotic placement of components and holds the components in place during the cure cycle of the adhesive. The fixture minimizes the possibilities that the parts might move during curing process. As a result, there is a lowered amount of rework necessary to the assembled board, and the overall success of the automated vapor phase assembly is enhanced.

IV. Multiple Fluxing for Vapor Phase Soldering

The PWB is now populated with components and is ready for the final vapor phase soldering procedure in which the components leads will be soldered to the pads of the PWB by means of the solder deposited thereon in a previous step. This final step includes a multiple fluxing as well as a controlled vapor phase solder reflow procedure. This process provides several unique advantages. Rework is reduced; i.e., the defect rate on missing toe fillets has dropped to less than 1% through using the process of this invention. A fixture is not needed to force the leads into the solder during vapor phase reflow. This is because, as described above, the component leads are in compression with the previously deposited solder due to the fact that the component body is secured to the printed wiring board by means of the adhesive. Through this procedure, sufficient flux is applied to the printed wiring board assembly so that the vapor phase condensation does not wash it all the way. The presence of flux during resolidification of the solder produces a shiny, smooth fillet. This fluxing reflow technique is directly applicable to soldering VHSIC insertion modules. This solder reflow process can also be employed with the leaderless chip carrier as described in U.S. Pat. No. 4,554,575 which is assigned to the assignee of the present invention and which is incorporated herein by reference.

The process developed for forming acceptable soldered joints in vapor phase soldering is as follows: A heavy application—that is to say, complete coverage of a RMA flux—is sprayed over the entire surface of the PWB where soldered joints are to be formed on the board pair. The flux is allowed to dry at room temperature for approximately 15 minutes. It is possible to dry the flux at room temperature for as little as 15 minutes; however, the flux should not be allowed to dry so that complete drying has taken place. It is most advantageous to allow the flux to dry for 15 minutes or for a period of time less than complete drying so that some solvent remains in the flux. In order for the flux to remain on the solder during reflow and not be washed away by the vapor condensation, the solvent vehicle in the flux must be allowed to evaporate from the flux within the constraints defined above. A second application of flux is sprayed over the entire surface where the soldered joints are to be formed on the board pair, as described above. After allowing the flux to dry, a third heavy application of flux is sprayed over the entire surface where soldered joints are to be formed. This three-step procedure deposits a heavy coating of flux on the PWB surface for vapor phase soldering. It has been found that the three coats of flux applied as described above, provides sufficient flux to the PWB so that smooth, shiny soldered joints and fillets are formed. Generally speaking, less than three applications of flux have provided less than satisfactory solder joints, and more than three applications of flux as described above have not significantly increased the quality of the soldered joint.

Figure 18:
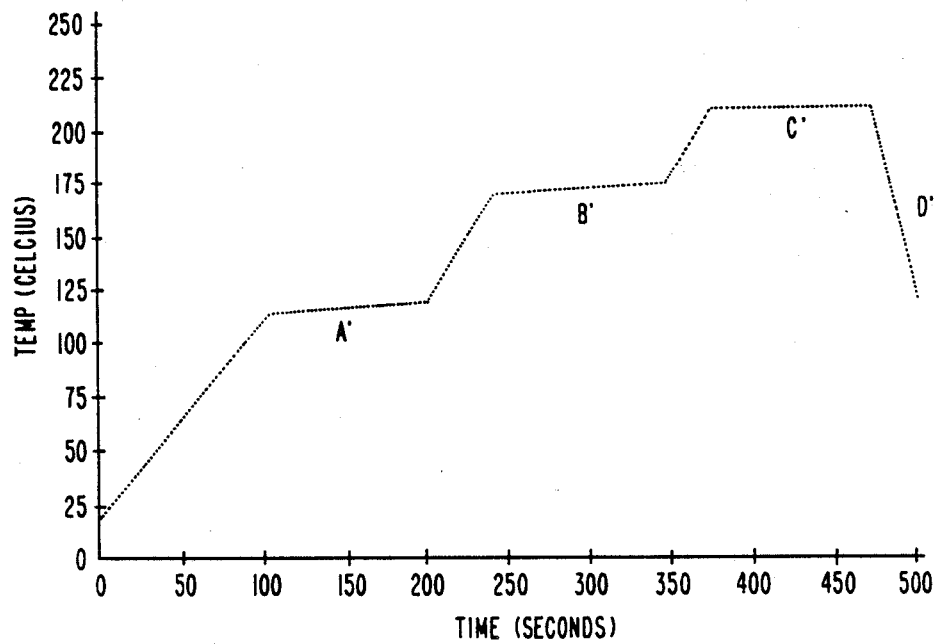
FIG. 18 is a graph illustrating the vapor phase soldering process of this invention.

The fluxed printed wiring assembly (PWA) is now vapor phase reflow soldered by means of a computer-controlled vapor phase method using a specified time temperature profile as shown in FIG. 18. This profile, when carefully followed, allows for a repeatable controlled solder reflow. The time profile has three distinct zones: Zone A' is designed to activate and outgas the flux, creating a better metallurgical soldered joint; Zone B' is designed to preheat the PWA to a temperature just below the melting point of the solder. The faster the joint is formed—that is to say, the less time the solder is molten, the shinier the soldered joint. The preheat zone allows Zone C' to be shorter. Zone C' is where the solder is actually reflowed to produce the solder joint. Zone D' indicates the cool down phase. Once again, the cool down phase is conducted rapidly in order to reduce the solder to a temperature so that intermetallic formation is complete.

Zone A' lasts for approximately 110 seconds at a temperature of approximately 125°. Zone B' is maintained for a period of approximately 120 seconds at a temperature of approximately 170°, and Zone C' is maintained at a temperature of approximately 212° for 100 seconds. Additional information is provided in Table II.

TABLE II

| TIME | 0 | 90 | 110 | 200 | 230 | 240 | 250 | 340 | 350 | 360 | 370 | 470 | 500 |
|---|---|---|---|---|---|---|---|---|---|---|---|---|---|
| TEMPERATURE | 20 | 105 | 115 | 120 | 160 | 165 | 170 | 175 | 183 | 195 | 210 | 211 | 120 |

After vapor phase reflow soldering of the PWA, the PWA is cleaned in a vapor defluxer with a solvent to remove flux residues. The PWA now has bright, shiny soldered joints with continuous fillets around the leads of the flatpacks. As previously described in conjunction with FIG. 7, the thermocouple of the elevator in the apparatus 11 provides real-time information to the computer-controlled process whereby the rate of descent or ascent within the vapor phase apparatus is controlled. Reference is made to that section for a more detailed discussion of this aspect of the invention. This process, by means of which component leads are soldered to the PWB by means of reflow soldering, eliminates occurrence of high defect rate caused by missing toe fillets in the soldered joint and also provides a uniform, shiny soldered joint.

What has been described are unique processes and apparatus for printed wiring board preparation and assembly.

What is claimed is:

1. A pressure fixture for vapor phase solder deposition of a pwb having a predetermined dimension and having a plurality of pad rows arranged in a predetermined pattern such that each pad row is a predetermined distance from at least one adjacent pad row, said pressure fixture comprising:

a first member and a second member each having means associated therewith to secure said first and second members together in an opposed relationship;

said first member including a first frame, a first thin compliant sheet and a plurality of first biasing means disposed therebetween and selectively spaced about the area of said first thin compliant sheet to correspond with the predetermined pattern of the pwb pad rows in order to resiliently urge said first thin compliant sheet to exert a compressive force upon the pwb at the locations of the predetermined pattern when a compressive force is applied to said first frame;

said second member including a second frame, a second thin compliant sheet and a plurality of second biasing means disposed therebetween and selectively spaced about the area of said second thin compliant sheet to correspond with the predetermined pattern of the pwb pad rows in order to resiliently urge said second thin compliant sheet to exert a compressive force upon the pwb at the locations of the predetermined pattern when a compressive force is applied to said second frame;

wherein a pwb is disposed between said first and said second members so as to be in contact with said first and second thin sheets and wherein the securing means cooperate to positively bias the pwb therebetween when a compressive force is exerted against said first frame and said second frame.

2. The pressure fixture for vapor phase solder deposition of a pwb having a predetermined dimension and having a plurality of pad rows arranged in a predetermined pattern such that each pad row is a determinable distance from at least one adjacent pad row according to claim 16 wherein said pressure fixture's thin sheet means is a thin sheet of stainless steel.

3. A pressure fixture for vapor phase solder deposition of a pwb having a predetermined dimension and having a plurality of pad rows arranged in a predetermined pattern such that each pad row is a predetermined distance from at least one adjacent pad row, said pressure fixture comprising:

a first member and a second member each having means associated therewith to secure said first and second members together in a an opposed relationship;

said first member including a first frame means, a first thin sheet means and a plurality of first biasing means disposed therebetween in order to secure said first thin sheet means to said first frame means, said first frame means includes a backup plate with mounting sites onto which the biasing means are mounted and which backup plate further defines a plurality of apertures therein adjacent the biasing means whereby a reduction of the backup plate's mass is achieved;

said second member including a second frame means, a second thin sheet means and a plurality of second biasing means disposed therebetween in order to secure said second thin sheet means to said second frame means, said second frame means includes a backup plate with mounting sites onto which the biasing means are mounted and which backup plate further defines a plurality of apertures therein adjacent the biasing means whereby a reduction of the backup plate's mass is achieved;

wherein a pwb is disposed between said first and said second members so as to be in contact with said first and second thin sheet means and the securing means cooperate to positively bias the pwb thereinbetween.

* * * * *